(12) United States Patent
Zhou et al.

(10) Patent No.: US 9,331,147 B1
(45) Date of Patent: May 3, 2016

(54) METHODS AND SYSTEMS FOR USING CONFORMAL FILLING LAYERS TO IMPROVE DEVICE SURFACE UNIFORMITY

(71) Applicant: Shanghai Huali Microelectronics Corporation, Shanghai (CN)

(72) Inventors: Haifeng Zhou, Shanghai (CN); Jun Tan, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/720,829

(22) Filed: May 24, 2015

(30) Foreign Application Priority Data

Apr. 20, 2015 (CN) .......................... 2015 1 0189718

(51) Int. Cl.
| | |
|---|---|
| *H01L 21/02* | (2006.01) |
| *H01L 29/08* | (2006.01) |
| *H01L 29/161* | (2006.01) |
| *H01L 21/3065* | (2006.01) |

(52) U.S. Cl.
CPC ........ *H01L 29/0847* (2013.01); *H01L 21/0245* (2013.01); *H01L 21/02532* (2013.01); *H01L 21/3065* (2013.01); *H01L 29/161* (2013.01)

(58) Field of Classification Search
CPC ............ H01L 29/0487; H01L 21/0245; H01L 21/02532; H01L 21/3065; H01L 21/02639; H01L 21/02381
USPC .......... 257/192, 190, 368, E21.125; 438/259, 438/425, 719
See application file for complete search history.

(56) References Cited

U.S. PATENT DOCUMENTS

| | | |
|---|---|---|
| 6,906,400 B2 | 6/2005 | Delhougne et al. |
| 6,946,350 B2 | 9/2005 | Lindert et al. |
| 6,949,482 B2 | 9/2005 | Murthy et al. |
| 7,494,884 B2 | 2/2009 | Lin et al. |
| 7,553,717 B2 | 6/2009 | Chakravarthi et al. |
| 7,615,390 B2 | 11/2009 | Meunier-Beillard et al. |
| 7,989,298 B1 | 8/2011 | Chan et al. |
| 8,017,487 B2 | 9/2011 | Chong et al. |

(Continued)

FOREIGN PATENT DOCUMENTS

EP 1801864 B1 11/2009

*Primary Examiner* — Yosef Gebreyesus
(74) *Attorney, Agent, or Firm* — Kilpatrick Twonsend & Stockton LLP

(57) ABSTRACT

The invention discloses a treatment process for a semiconductor, comprising providing a substrate; defining a trench opening region of the substrate; performing plasma etching to form a trench region at the trench opening region; subjecting the substrate to a first epitaxial process with a first plurality of gaseous species to form a protective layer overlaying at least the first sidewall and the bottom of the trench region; and subjecting the substrate and the protective layer to a second epitaxial process with a second plurality of gaseous species to form a filling material overlaying the protective layer and being positioned at least partially within the trench region. The invention further provides a semiconductor processing technique used to eliminate or reduce dislocation defect on the semiconductor device and improve device performance. In the treatment process, at least one epitaxial process to form the protective layer overlaying at least the first sidewall and the bottom of the trench region corresponds to form a filling material overlaying the protective layer and being positioned at least partially within the trench region.

15 Claims, 11 Drawing Sheets

(56) References Cited

U.S. PATENT DOCUMENTS

| | | | |
|---|---|---|---|
| 8,183,118 B2 | 5/2012 | Lu et al. | |
| 8,674,447 B2 | 3/2014 | Adam et al. | |
| 8,674,450 B1* | 3/2014 | Deng | H01L 29/66477 257/368 |
| 8,741,726 B2* | 6/2014 | Lin | H01L 21/02057 257/E21.43 |
| 8,975,144 B2* | 3/2015 | Kwok | H01L 29/045 438/294 |
| 9,117,843 B2* | 8/2015 | Wong | H01L 29/66636 |
| 2005/0148147 A1 | 7/2005 | Keating et al. | |
| 2006/0138398 A1 | 6/2006 | Shimamune | |
| 2007/0187767 A1* | 8/2007 | Yasutake | H01L 21/28518 257/368 |
| 2008/0121929 A1* | 5/2008 | Lai | H01L 21/26506 257/190 |
| 2008/0290370 A1 | 11/2008 | Han | |
| 2011/0024804 A1* | 2/2011 | Chang | H01L 29/165 257/288 |
| 2012/0319120 A1 | 12/2012 | He et al. | |
| 2012/0319168 A1 | 12/2012 | Liu et al. | |
| 2012/0326268 A1 | 12/2012 | Kato et al. | |
| 2013/0161751 A1* | 6/2013 | Chung | H01L 21/823412 257/368 |
| 2015/0187773 A1* | 7/2015 | Niimi | H01L 21/823807 257/369 |
| 2015/0270127 A1* | 9/2015 | Li | H01L 21/02359 438/425 |

* cited by examiner

METHODS AND SYSTEMS FOR USING CONFORMAL FILLING LAYERS TO IMPROVE DEVICE SURFACE UNIFORMITY

CROSS-REFERENCES TO RELATED APPLICATIONS

The present application claims priority to Chinese Patent Application No. 201510189718.4, filed on Apr. 20, 2015, entitled "METHODS AND SYSTEMS FOR USING CONFORMAL FILLING LAYERS TO IMPROVE DEVICE SURFACE UNIFORMITY", which is incorporated by reference herein for all purposes.

BACKGROUND OF THE INVENTION

The present invention is directed to semiconductor processes and devices.

Since the early days when Dr. Jack Kilby at Texas Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of the semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus becoming more and more challenging and pushing toward the boundary of what is physically possible. Huali Microeletronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing of complementary metal-oxide-semiconductor (CMOS) with an adjustable band gap. While conventional techniques exist for SiGe based processes, these techniques are unfortunately inadequate for the reasons provided below. Therefore, improved methods and systems are desired.

Figure 1A:
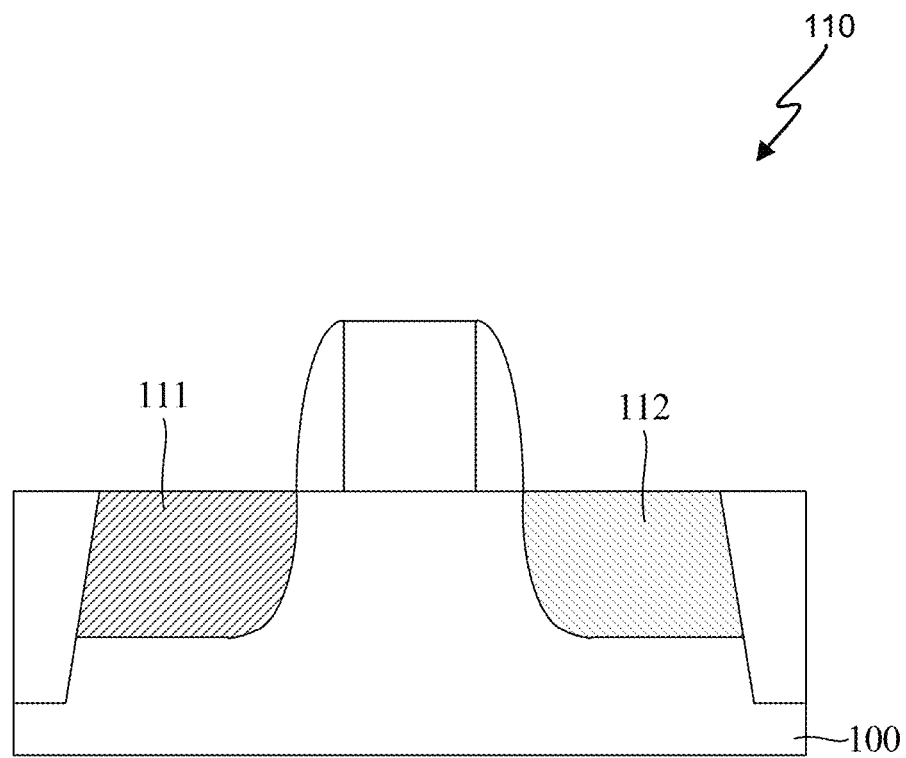
FIG. 1A-1C illustrates schematic diagrams of a device structure manufactured by the e-SiGe PMOS method in the prior art.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present invention is directed to semiconductor processes and devices. In a specific embodiment, a filling material overlaying a protective layer is used as an intermediate layer during one of the semiconductor processes to improve surface uniformity of the underlying semiconductor device. There are other embodiments as well.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

This disclosure relates in general to a semiconductor processing technique used to eliminate or reduce dislocation defect on the semiconductor device and improve device performance. In the treatment process, a substrate is subjected to at least two epitaxial processes, where the filling material overlaying the protective layer is formed. The substrate comprises semiconductor materials. More specifically, a surface of the substrates has undesirable defects. The protective layer treatment comprises the steps of subjecting the surface of the substrate to an epitaxial process, which results in forming a protective layer on the surface of the substrate. The protective layer comprises a first silicon germanium material having a component ratio less than 20% of germanium material. The filling material comprises a second silicon germanium material having a component ratio more than 40% of germanium material. During the process of forming the filling material layer, some of the undesirable defects that were present on the surface of the substrate prior to the epitaxial process are improved, and a concentration gradient between the silicon substrate and the high concentration of germanium silicon is formed, now with substantially less undesirable surface defects.

Compared with the prior art, the defects on the surface of the substrate can be reduced or eliminated by the protective-filling material layer treatment, so that the surface of the substrate is substantially uniform, and these characteristics are important for the subsequent processes. For example, to fill the etched trench with filling materials, the quality of the filling material and the structure depend on the surface flatness and uniformity. More specifically, the filling material shares an interface with the surface of the substrate, and poor uniformity of the surface of the substrate can lead to poor interface between filling material and the surface of the substrate. Moreover, if a groove surface has defects, germanium silicon will not be able to form a good single crystal structure. This would lead to relaxation, and strain accumulated in the thin film may cause crystal the surface to slip and alternate the interfacial atoms arrangement. If the strain is released sharply, it may produce a large number of defects on the film, leading to strain relaxation.

It is appreciated that the quality of the surface of the substrate can have significant impact on the integrated circuits that are formed thereon. For example, a large-scale integrated circuit needs a large number of transistor units to manufacture. The transistor units make up for the main circuit element for designing the circuit. In certain applications, such as complex integrated circuits (such as microprocessor and storage wafer), complementary metal oxide semiconductor (CMOS) technology can provide the desired characteristics of operation speed, power consumption and cost benefit. It is thus to be appreciated that CMOS (including P-channel transistor and N-channel transistor, namely, PMOS and NOMS) technology can benefit from the processes and systems according to embodiments of the present invention. For example, N-channel transistor or P-channel transistor comprises a P-N interface that is formed by a high doped drain area and a source area, as well as an interface of reversely or weakly doped channel area between the drain area and the source area. The conductivity of the channel area (namely, drive current ability of the conductive channel) is dictated by the gate electrode formed around the channel area and separated by a thin insulating layer. When a suitable control voltage is applied to the gate electrode to form the conductive channel, the conductivity coefficient of the channel area depends on dopant concentration, charge carrier mobility, and distance (also named as channel length) between the source area and the drain area as far as the given extension of the channel area in the width direction of the transistor. The reduction of channel length and the resistivity of the related channel resistance are the main design objectives for increasing the operation speed of the large-scale integrated circuit.

There have been various ways in improving performance and reliability of integrated circuits. With continuous reduction of critical dimension, new development of highly complex technology is needed. More specifically, the reduction of the migration rate is likely to provide performance gain, and thus it has been suggested that the channel conductivity of the transistor unit can be improved by increasing the charge carrier mobility in the channel area with given length.

An effective method for increasing the charge carrier mobility is to modify the lattice structure in the channel area. For example, stretching or compression stress is generated around the channel area to provide corresponding strain in the channel area, which causes the changed migration rate of the electronic and cavity. Whereas substrate comprises silicon material, the stretching strain generated in the channel area can increase the migration rate of the electronic and increase the conductivity directly. On the other hand, the compression strain in the channel area can increase the migration rate of the cavity, and thus it can improve the performance of P-type transistor. In various implementations, stress or strain engineered into to the large-scale integrated circuit, where the strained silicon can be regarded as the new semiconductor material that can be manufactured quickly and strongly without expensive or inexpensive semiconductor material. In addition, integrated circuits with engineered strains and/or stress can be manufactured by many existing techniques.

The silicon-germanium material adjacent to the channel area can induce compression strain of the corresponding train. In conventional CMOS manufacturing techniques, silicon germanium material (e.g., e-SiGe) adds compressive stress in the channel area to boost the performance of PMOS. More specifically, the silicon-germanium material is formed in the drain and source areas of the transistor. The drain and source areas of the compression strain generate a single-shaft stress in the adjacent silicon channel area. When the silicon-germanium material is formed, the drain and source areas of the PMOS transistors are selectively removed to form a cavity. The NMOS transistor is shielded. The silicon-germanium material is selectively formed in PMOS transistor by epitaxial growth.

As an example, SiGe technology refers to a SiGe heterojunction bipolar transistor (HBT) that offers advantages over both conventional silicon bipolar and silicon CMOS for implementation of communications circuits. An important aspect of forming SiGe-based devices is to provide a concentration gradient pattern between the silicon substrate and the high concentration of germanium silicon in order to reduce dislocation defect on the semiconductor device and improve device performance. In an embodiment, a SiGe CMOS manufacturing process may cause various detention of logic gate patterning, such as 45/40 nm, 32/28 nm, and <22 nm.

Figure 1B:
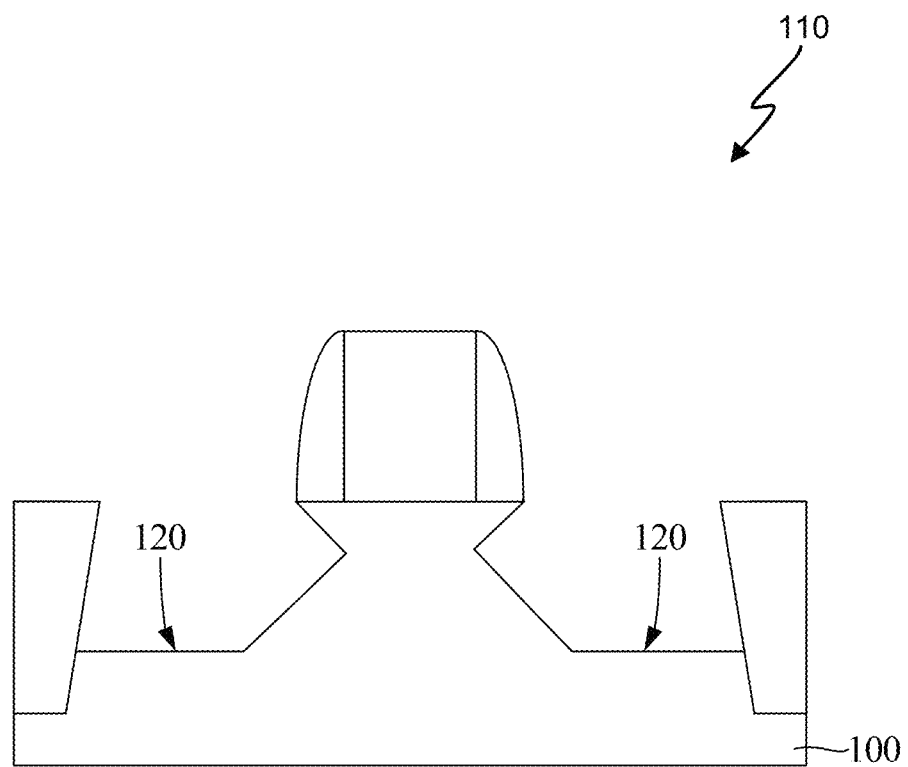
Figure 1C:
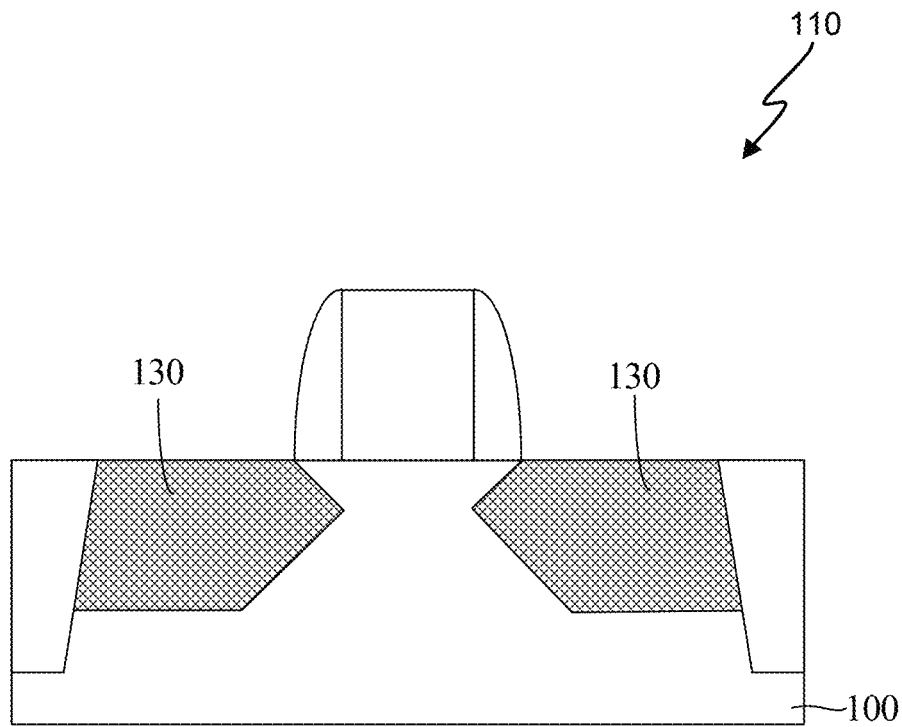
Figure 2:
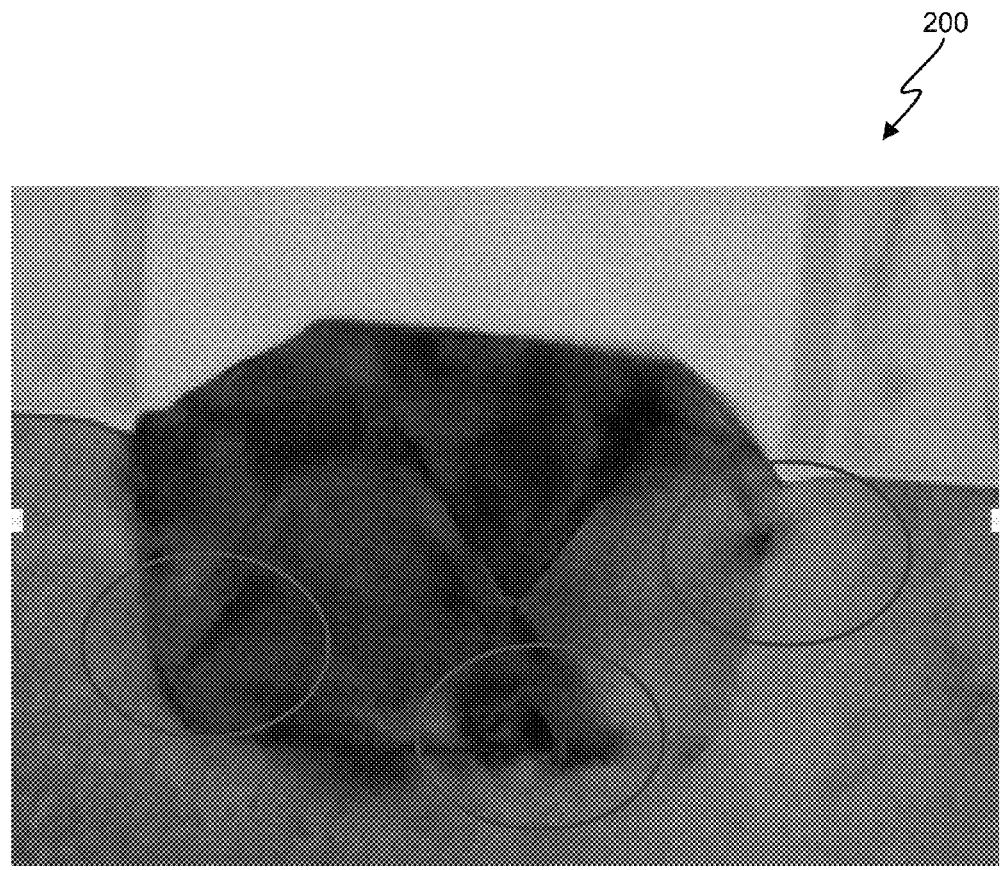
FIG. 2 illustrates an example of a transmission electron microscopy (TEM) image of an e-SiGe film in prior art.
Figure 3:
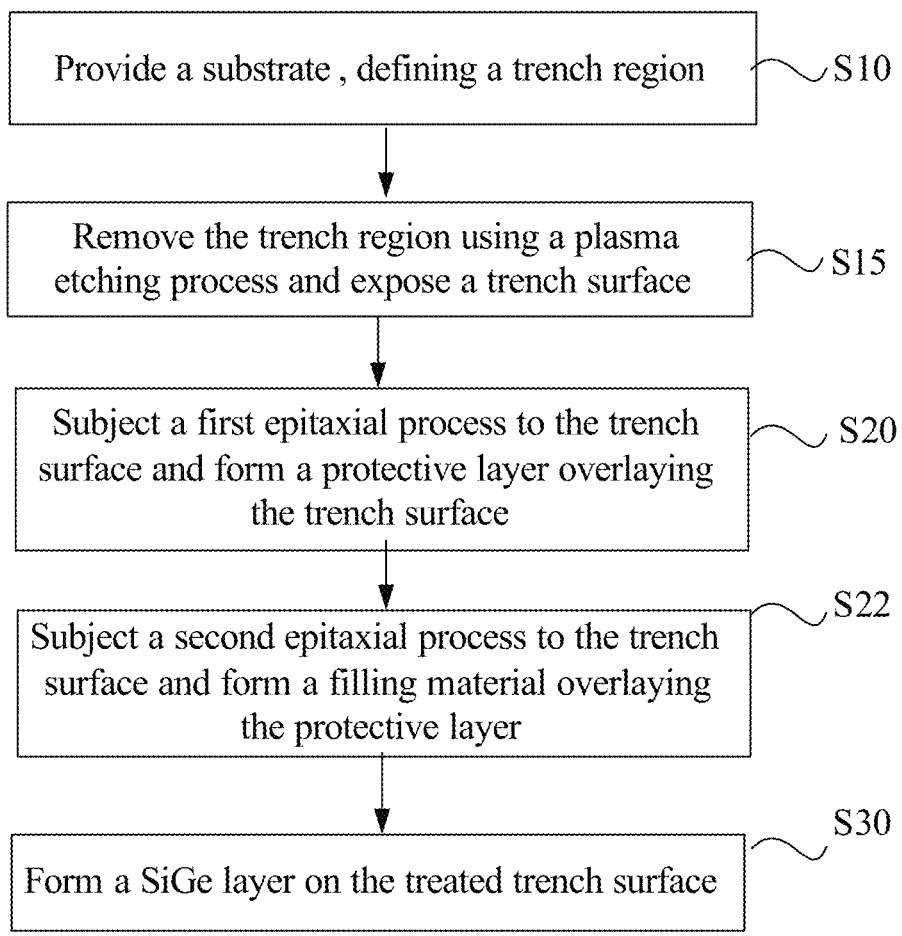
FIG. 3 illustrates a flow chart of a preparation method according to an embodiment of the present invention.

FIGS. 1A-1C illustrate conventional plasma etching processes. Typically, plasma etching technology is adopted during the process of forming a trench region 120 in the source area 111 and drain area 112. When the plasma etches the silicon substrate 100, the plasma strafes the surface of the silicon substrate 100. FIG. 2 illustrates an example of a transmission electron microscopy (TEM) photo of an e-SiGe film in prior art. Uneven surface of trench region 120 is attributed to the convention plasma process as shown in three circled regions of a SiGe film in FIG. 2. More specifically, the two circle regions in FIG. 2 highlight the surface defects, which are seen as dark lines. For example, the defects are often associated with lattice mismatch at the atomic level. More specifically, due to dislocation of underlying lattice structure, a SiGe film overlying the surface defects of the silicon material often includes "lines" as shown in FIG. 2, as the dislocation and poor alignment of the underlying silicon material cascade into the SiGe film.

There could be various reasons for the dislocation defects. For example, during the process that the strain induction layer 130 is formed in the trench region (as shown in FIG. 1C), when the silicon-germanium layer is formed, the unevenness of the surface of the trench region 120 affects the formation of silicon-germanium crystal nucleus, so that the silicon-germanium material is misplaced, and dislocation defets are formed.

The existing extension technological process mainly includes: wet process epitaxial cleaning; corrosion or lamination of the cavity; baking with $H_2$ before the epitaxial growth and germanium silicon deposition. A certain percentage of defects are found on surfaces after cleaning of the groove, which leads to produce defects in interface after the epitaxial growth and the serious ones may continue to the growth surface of germanium silicon (as shown in FIG. 2).

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Embodiments of the present invention provide ways of addressing the dislocation defect issues described above. According to embodiments of the present invention, the low concentration of germanium layer can help the transition between substrate materials and germanium silicon of high concentration which is used to reduce the mismatching of grid numbers caused by large difference of germanium concentration, so as to result in serious dislocation defects. In various implementations described below, the surface of the trenched region (e.g., etched by plasma etching) is processed to be substantially flat and uniform, which translates to a uniformity and regularity in the silicon germanium material that overlays the surface of the trenched region.

Embodiments of the present invention relate in general to treatment process for a semiconductor. According to an embodiment, the present invention provides a process that includes providing a substrate; defining a trench opening region of the substrate; performing plasma etching to form a trench region at the trench opening region; subjecting the substrate to a first epitaxial process with a first plurality of gaseous species to form a protective layer overlaying at least the first sidewall and the bottom of the trench region; and subjecting the substrate and the protective layer to a second epitaxial process with a second plurality of gaseous species to form a filling material overlaying the protective layer and being positioned at least partially within the trench region. Depending on the implementation, the first or the second epitaxial process can be repeated to ensure a desired surface quality if achieved. The defects on the surface of the substrate can be reduced or eliminated by the filling material-protective layer treatment, so that the concentration gradient between the silicon substrate and the high concentration of germanium silicon is formed, now with substantially less undesirable surface defects. In one embodiment, a uniform covering transition layer is formed, and dislocation defect rate is reduced in the process of reaction to germanium silicon epitaxial. It is to be appreciated that one or more of these steps may be added, removed, repeated, replaced, modified, rearranged, and/or overlapped, which should not limit the scope of the claims.

The treatment process for the semiconductor and the preparation method for a semiconductor device provided by the invention are described in details by combining FIG. 3, and FIG. 4A-4D. FIG. 4 is a simplified flow chart of the preparation method for semiconductor method in one embodiment of the invention. This diagram is merely an example, which should not unduly limit the scope of the claims. One of ordinary skill in the art would recognize many variations, alternatives, and modifications. For example, one or more steps in FIG. 4 can be added, removed, replaced, rearranged, modified, and/or overlapped, which should not limit the scope of the claims. FIG. 4A-FIG. 4D are simplified schematic diagrams of device structure in the preparation method for semiconductor method in one embodiment of the invention.

Figure 4A:
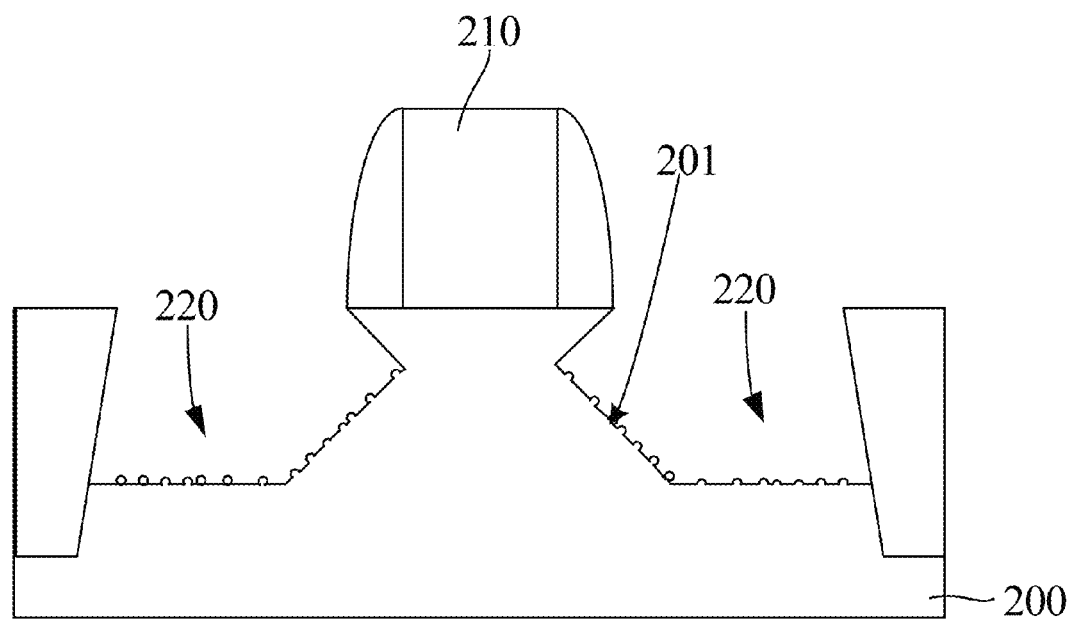
FIGS. 4A-4D illustrate schematic diagrams of device structures in the preparation method according to an embodiment of the present invention.

Firstly, at step S10, a substrate 200 is provided, trench region 220 is defined on the substrate 200, as shown in FIG. 4A. In an embodiment, the substrate 200 is a silicon substrate. The substrate 200 is not limited to the silicon substrate. For example, the substrate 200 can be silicon-germanium substrate or silicon-carbon substrate which is in the scope of the invention. In an embodiment, the substrate 200 further comprises additional device structure, such as grid 210. The trench region 220 can be formed by an etching process. For example, lithography is performed to define the trenches to be formed, and the plasma etching process is performed to form the trenches. Depending on the implementation, other types of methods may be used as well to define the trench region(s).

In step S15, a plasma etching process is used to remove the trench region 220. A trench surface comprising surface defects is exposed. The surface of trench region 220 is damaged during the process of preparing the trench region 220, and an uneven rough surface 201 is formed, as shown in FIG. 4A. For example, the damage is often caused by the etching process. For example, during a plams etching process, HCl and/or other types of material are used to remove materails from the substrate. The newly exposed surface is typically uneven since a layer of substrate material is removed. Additionally, since HCl and/or other type of etchants are used during the etching process, etchants may stay on the top surface of the trench region 220 as byproducts described above.

Next, the step S20 is carried out. At least one epitaxial treatment process is carried out to the trench region 220 to form a protective layer. Depending on the implementation, step S20 may be repeated. In an embodiment, a cleaning step can be carried out before carrying out step S20, to remove the residue in trench region 220. Preferably, it is cleaned by the wet process.

Figure 4B:
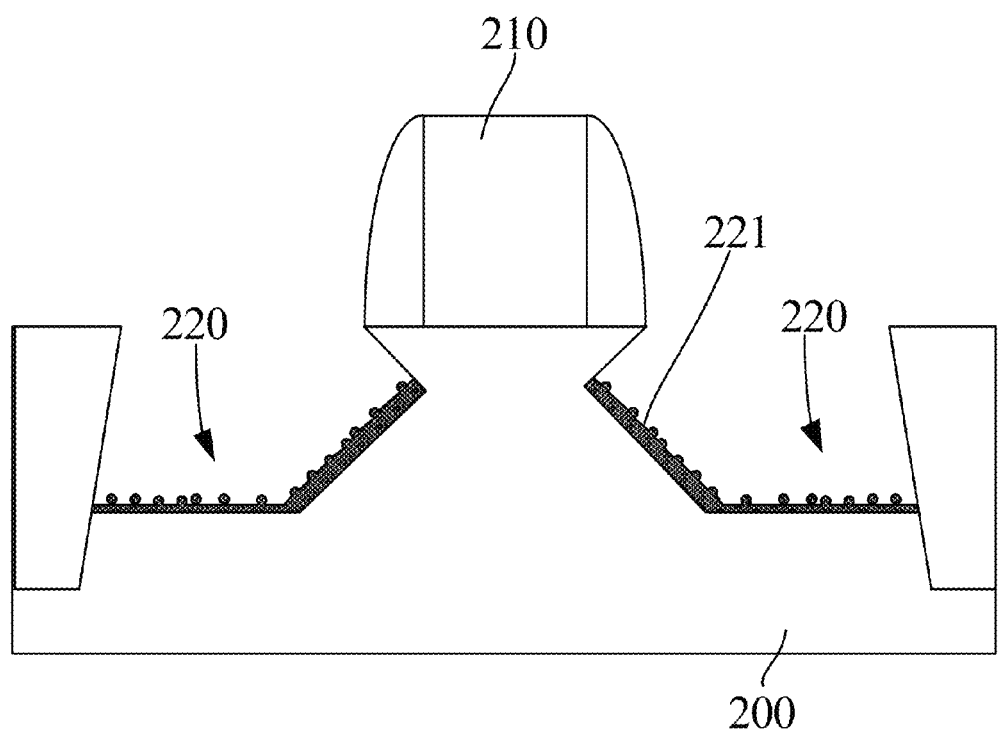

At step S20, the surface of the trench region 220 is subjected to the first epitaxial treatment. For example, a protective layer 221 is formed on the surface of the trench region 220 as shown in FIG. 4B. Preferably, the surface of the trench region 220 is subjected to the first epitaxial treatment by the plasma etching apparatus. The plasma etching apparatus can etch the trench region 220 directly without using additional systems or devices. For example, the thickness of the protective layer 221 is normally between 2 nm-20 nm, for example, 2 nm, 4 nm, 10 nm and the like. It is to be understood that the thickness of the protective layer 221 is not limited in the above scope and the thickness is in the nano meter order and less than micro meter order. For example, during the removing process, thick protective layer may damage the surface of the trench region 220. Instead of forming thick protective layer 221, the protective-removal process may be repeated to smoothen the trench surfaces.

In a specific embodiment, process conditions of the plasma etching machine in step S20 are as follows: the flow of the gas is 20 sccm (standard-state cubic centimeter per minute)-50 sccm (such as 30 sccm, 40 sccm); the source power is 300 w-500 w (such as 400 w); the bias voltage is 0; and the time is 5 s-15 s (such as 8 s, 10 s, and 12 s). In an embodiment, the process conditions of the plasma etching machine in step S20 are as follows: pressure is 20 mt; the source power is 150 w; bias voltage is 0; the flow of $SiH_2Cl_2$ gas is 1 sccm; the flow of HCl gas is 0.1 sccm-0.5 sccm; the flow of $GeH_4$ gas is 0.5 sccm-1 sccm and the temperature is 50° C.-70° C. The use of $GeH_4$ gas may result in the first silicon germanium material having a component ratio less than 20% of germanium material. It is to be appreciated that these parameters can largely depend on the material and machine used, and can be modified depending on the specific implementations. For example, the source power depends largely on the operating efficiency and setup of the machines. Additionally, temperature and pressure are interrelated. For example, pressures tends to go up as temperature goes up.

A thin and uniform protective layer can be formed on the surface of the trench region 220 by the above process conditions. The process conditions are not limited in the above scope. Embodiments of the present invention provide a protective layer 221 that is formed with sufficient thickness to later allow for smoothening of the trench surface. In various embodiments, the protective layer 221 is substantially even and uniformed when formed using the epitaxial process described above.

Figure 4C:
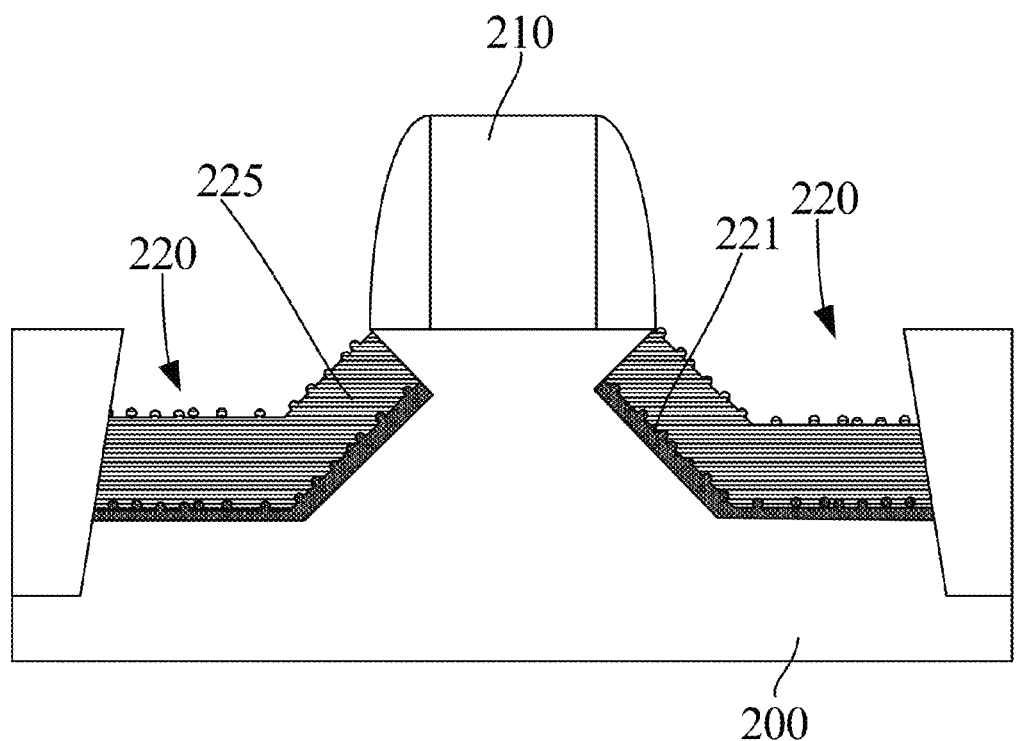

At step S22, the surface of the protective layer 221 is subjected to the second epitaxial treatment. For example, a filling material layer is formed on the surface of the protective layer 221 as shown in FIG. 4C. Preferably, the surface of the protective layer 221 is subjected to the second epitaxial treatment by the plasma etching apparatus. The plasma etching apparatus can etch the protective layer 221 directly without using additional systems or devices. For example, the thickness of the filling material layer 225 is normally between 2 nm-50 nm, for example, 2 nm, 10 nm, 20 nm and the like. It is to be understood that the thickness of the filling material layer 225 is not limited in the above scope and the thickness is in the nano meter order and less than micro meter order. For example, during the removing process, the thick filling material layer may damage the surface of the protective layer 221. Instead of forming thick filling material layer, the protective-removal process may be repeated to smoothen the protective layer.

In a specific embodiment, process conditions of the plasma etching machine in step S22 are as follows: the flow of the gas is 20 sccm (standard-state cubic centimeter per minute)-50 sccm (such as 30 sccm, 40 sccm); the source power is 300 w-500 w (such as 400 w); the bias voltage is 0; and the time is 5 s-15 s (such as 8 s, 10 s, and 12 s). In an embodiment, the process conditions of the plasma etching machine in step S22 are as follows: pressure is 20 mt; the source power is 150 w; bias voltage is 0; the flow of $SiH_2Cl_2$ gas is 1 sccm; the flow of HCl gas is 1.5 sccm-2 sccm; the flow of $GeH_4$ gas is 1 sccm-2 sccm and the temperature is 50° C.-70° C. The use of $GeH_4$ gas may result in the second silicon germanium material having a component ratio more than 40% of germanium material. It is to be appreciated that these parameters can largely depend on the material and machine used, and can be modified depending on the specific implementations. For example, the source power depends largely on the operating efficiency and setup of the machines. Additionally, temperature and pressure are interrelated. For example, pressures tends to go up as temperature goes up.

In step S22, the uneven rough surface 201 is oxidized to a rough protective layer. The filling material layer is overlayed on the protective layer when carrying out step S22 so that the treated trench surface and the protective layer being substantially free from surface defects. If the circulation of step S20 and step S22 dose not reach the effect, it can repeat step S20 until the trench region 220 is flat and uniform, and repeat step S22 until the protective layer is flat and uniform. Depending on the implementation, the number of iterations of performing step S20 and step S22 can be based on a predefined processes or determined by empirical data. For example, the type of plasma etching performed at S15 may affect the number of iterations.

Figure 4D:
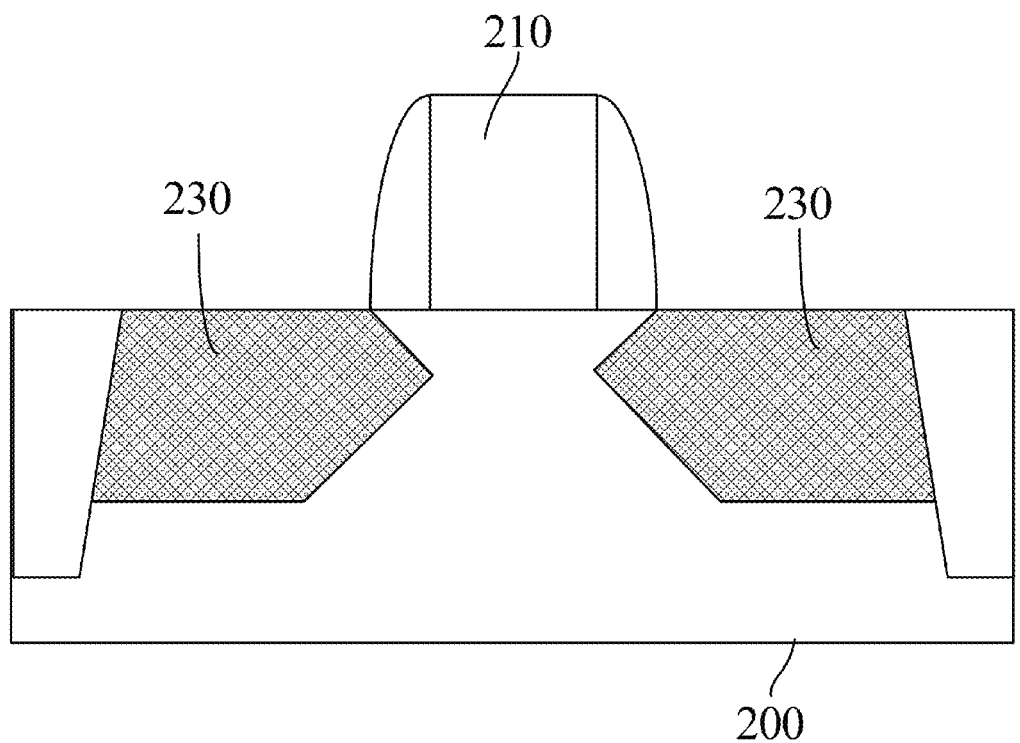

Optionally, carrying out step S30, a layer of silicon germanium material is formed overlaying the filling material layer surface to make the desired thickness of silicon germanium material, as shown in FIG. 4D. The substrate 200 is the silicon substrate. The strain induction layer 230 can be made of silicon-germanium and not limited to silicon-germanium. It is to be appreciated that after step S30, additional processes are performed to form the desired devices. For example, to form a CMOS devices, additional processes are performed to form drain, source, and gate regions.

Figure 5A:
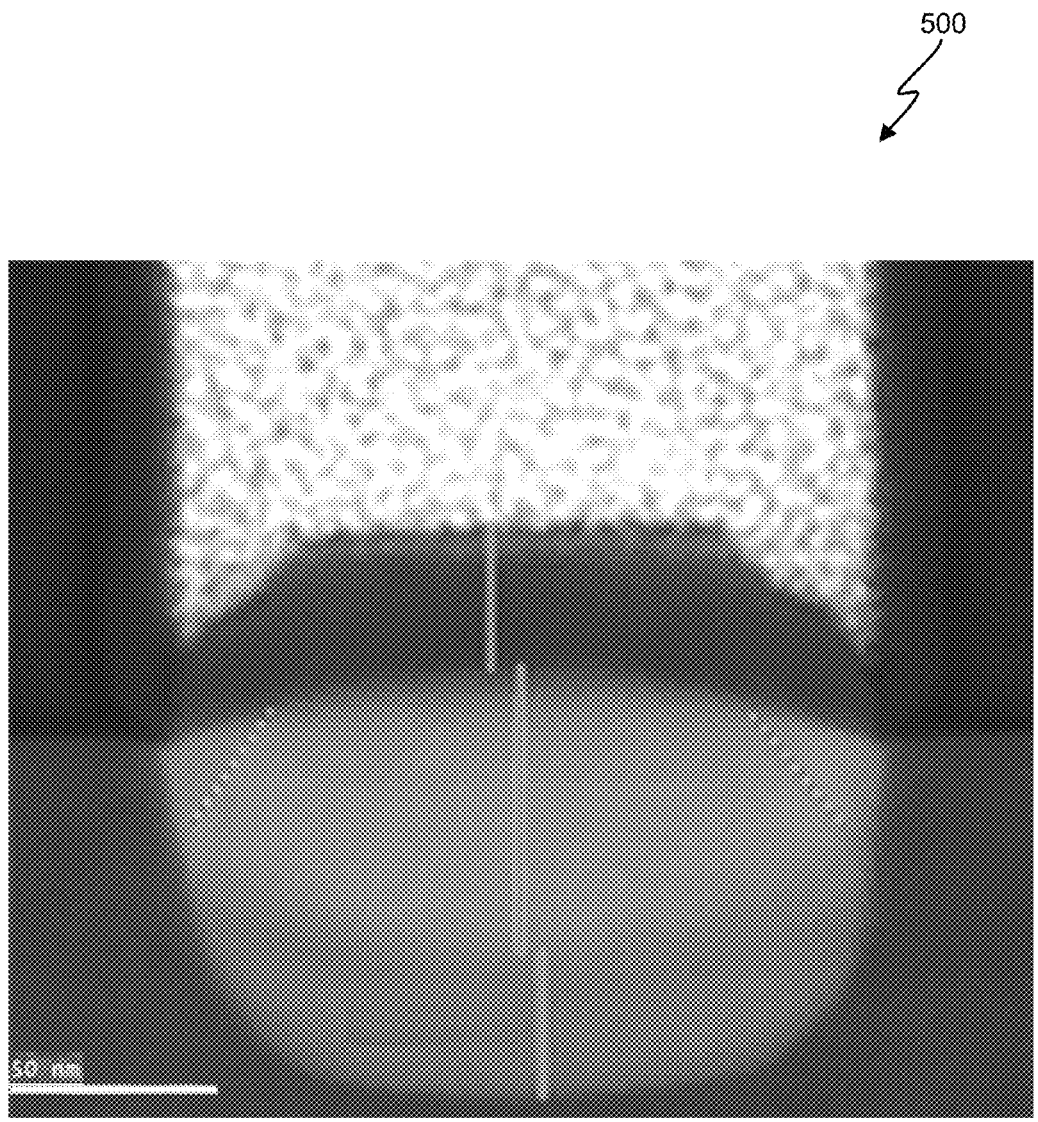
FIGS. 5A-5B illustrate a TEM photo of an e-SiGe film before and after using a filling material overlaying a protective layer in the preparation method according to an embodiment of the present invention.
Figure 5B:
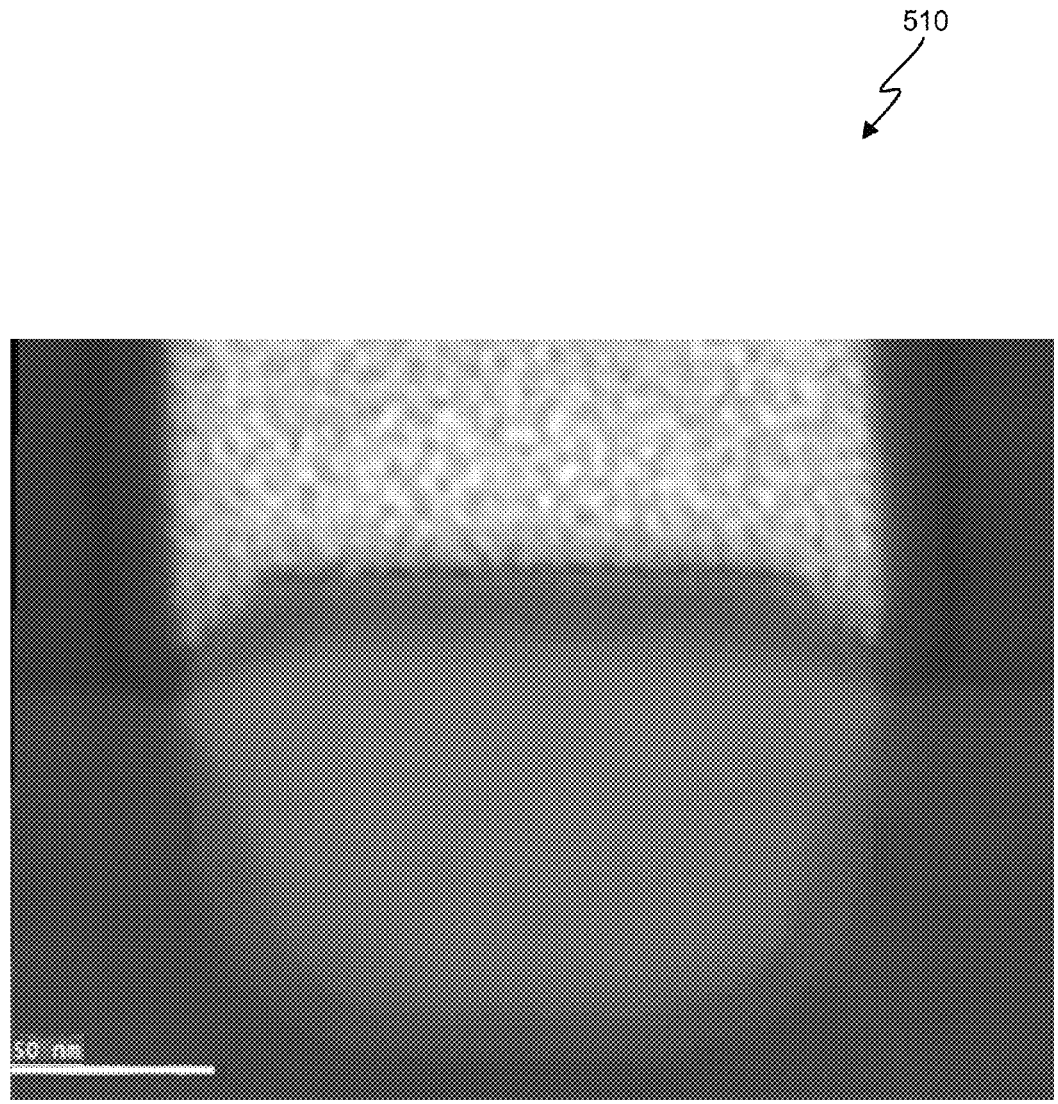

FIG. 5A shows a TEM photo of one e-SiGe film 500 without the treatment of the filling material layer overlaying the protective layer, and FIG. 5B shows a TEM photo of another e-SiGe film 510 after using the treatment of the filling material layer overlaying the protective layer. The traditional transition layer growth pattern can only cover groove area, but cannot cover the side walls, leading to a lot of dislocation defects found in walls (As shown in FIG. 5A). With the treatment of a low concentration of germanium and optimize the mode of growth to uniformly cover the groove walls, the e-SiGe film 510 regularly has SiGe crystal growing along the lattice direction with flat surfaces of the trench region 120. The use of the filling material-protective layer treatment, dislocation, strain relaxation and misplaced problems are avoided and the morphology of the SiGe growth is improved (As shown in FIG. 5B).

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A semiconductor device comprising:
a substrate comprising silicon material;
a trench region positioned within the substrate, the trench region being characterized by a depth of at least 300 angstroms, the trench region having at least a first sidewall and a bottom, a surface overlaying at least the first sidewall and the bottom comprising a plurality of dislocation defects contributing to a height differential of up to 10% on the surface;

a protective layer overlaying at least the first sidewall and the bottom of the trench region, the protective layer comprises a first silicon germanium material, the first silicon germanium material having a component ratio less than 20% of germanium material, the protective layer overlaying being characterized by a thickness of at least 50 angstroms overlying the bottom of the trench region;

a filling material overlaying the protective layer and being positioned at least partially within the trench region, the filling material comprising a second silicon germanium material having a component ratio more than 40% of germanium material.

2. The device of claim 1, wherein the depth is at least 500 angstroms.

3. The device of claim 1, wherein the protective layer is characterized by a tapered profile near an edge of the trench region, the tapered profile being characterized by a thickness of about 20 angstroms.

4. The device of claim 1, wherein the first silicon germanium material comprises a germanium concentration gradient, wherein the germanium concentration increases from 0% to about 20% across a thickness of the protective layer.

5. The device of claim 1, wherein the protective layer is having a thickness of 50 to 200 angstroms.

6. A method for processing a semiconductor substrate, the method comprising:

providing a substrate, the substrate consisting essentially of silicon material;

defining a trench opening region of the substrate;

performing plasma etching to form a trench region at the trench opening region, the trench region being characterized by a depth of at least 300 angstroms, the trench region having at least a first sidewall and a bottom, a surface overlaying at least the first sidewall and the bottom comprising a plurality of dislocation defects contributing to a height differential of up to 10% on the surface;

subjecting the substrate to a first epitaxial process with a first plurality of gaseous species to form a protective layer overlaying at least the first sidewall and the bottom of the trench region, the protective layer comprises a first silicon germanium material, the first silicon germanium material having a component ratio less than 20% of germanium material, the protective layer overlaying being characterized by a thickness of at least 50 angstroms overlying the bottom of the trench region; and subjecting the substrate and the protective layer to a second epitaxial process with a second plurality of gaseous species to form a filling material overlaying the protective layer and being positioned at least partially within the trench region, the filing material comprising a second silicon germanium material having a component ratio more than 40% of germanium material.

7. The device of claim 6, wherein the depth is at least 500 angstroms.

8. The device of claim 6, wherein the protective layer is characterized by a tapered profile near an edge of the trench region, the tapered profile being characterized by a thickness of about 20 angstroms.

9. The device of claim 6, wherein the first silicon germanium material comprises a germanium concentration gradient, wherein the germanium concentration increases from 0% to about 20% across a thickness of the protective layer.

10. The device of claim 6, wherein the protective layer is having a thickness of 50 to 200 angstroms.

11. A processed semiconductor device, comprising:

a substrate comprising silicon material;

a trench region positioned within the substrate, the trench region being characterized by a depth of at least 300 angstroms, the trench region having at least a first sidewall and a bottom, a surface overlaying at least the first sidewall and the bottom comprising a plurality of dislocation defects contributing to a height differential of up to 10% on the surface;

a protective layer overlaying at least the first sidewall and the bottom of the trench region, the protective layer comprises a first silicon germanium material, the first silicon germanium material having a component ratio less than 20% of germanium material, the protective layer overlaying being characterized by a thickness of at least 50 angstroms overlying the bottom of the trench region;

a filling material overlaying the protective layer and being positioned at least partially within the trench region, the filling material comprising a second silicon germanium material having a component ratio more than 40% of germanium material.

12. The semiconductor device of claim 11, wherein the depth is at least 500 angstroms.

13. The semiconductor device of claim 11, wherein the protective layer is characterized by a tapered profile near an edge of the trench region, the tapered profile being characterized by a thickness of about 20 angstroms.

14. The semiconductor device of claim 11, wherein the first silicon germanium material comprises a germanium concentration gradient, wherein the germanium concentration increases from 0% to about 20% across a thickness of the protective layer.

15. The semiconductor device of claim 11, wherein the protective layer is having a thickness of 50 to 200 angstroms.

* * * * *